(12) United States Patent
Fong

(10) Patent No.: US 7,630,258 B2
(45) Date of Patent: Dec. 8, 2009

(54) DECODER BASED SET ASSOCIATIVE REPAIR CACHE SYSTEMS AND METHODS

(75) Inventor: John Y. Fong, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 630 days.

(21) Appl. No.: 11/230,438

(22) Filed: Sep. 20, 2005

(65) Prior Publication Data

US 2006/0085700 A1  Apr. 20, 2006

Related U.S. Application Data

(60) Provisional application No. 60/614,878, filed on Sep. 30, 2004.

(51) Int. Cl.
*G11C 29/00* (2006.01)
(52) U.S. Cl. .................... 365/200; 365/185.09
(58) Field of Classification Search ............... 365/200, 365/185.09
See application file for complete search history.

(56) References Cited

U.S. PATENT DOCUMENTS 6,055,204 A * 4/2000 Bosshart ............... 365/230.06
6,108,250 A * 8/2000 Kengeri ................. 365/200
6,807,114 B2 * 10/2004 Keeth et al. ............. 365/200
2005/1002805    * 2/2005 Roohparvar ............ 714/710
2005/0232035 A1 * 10/2005 Miyakawa et al. ...... 365/200

* cited by examiner

*Primary Examiner*—Hoai V Ho
*Assistant Examiner*—Anthan T Tran
(74) *Attorney, Agent, or Firm*—Dawn V. Stephens; Wade James Brady, III; Frederick J. Telecky, Jr.

(57) ABSTRACT

The present invention facilitates memory devices and operation thereof by employing a repair cache system 600 to correct or repair identified faulty memory locations. The repair cache system 600 includes a decoder that selects local repair location addresses from repair sets 610 according to a repair region address 604. Comparators 616 compare the selected local repair location addresses with a local repair address 606 to identify a match. Repair register banks 622 that comprise a plurality of repair registers are selected if an associated comparator 606 identifies a match. Then, a register within the associated register bank is selected according the repair region address 604 for read/write access. If a match is not identified, a memory location from a main memory 630 is selected for read/write access.

19 Claims, 8 Drawing Sheets

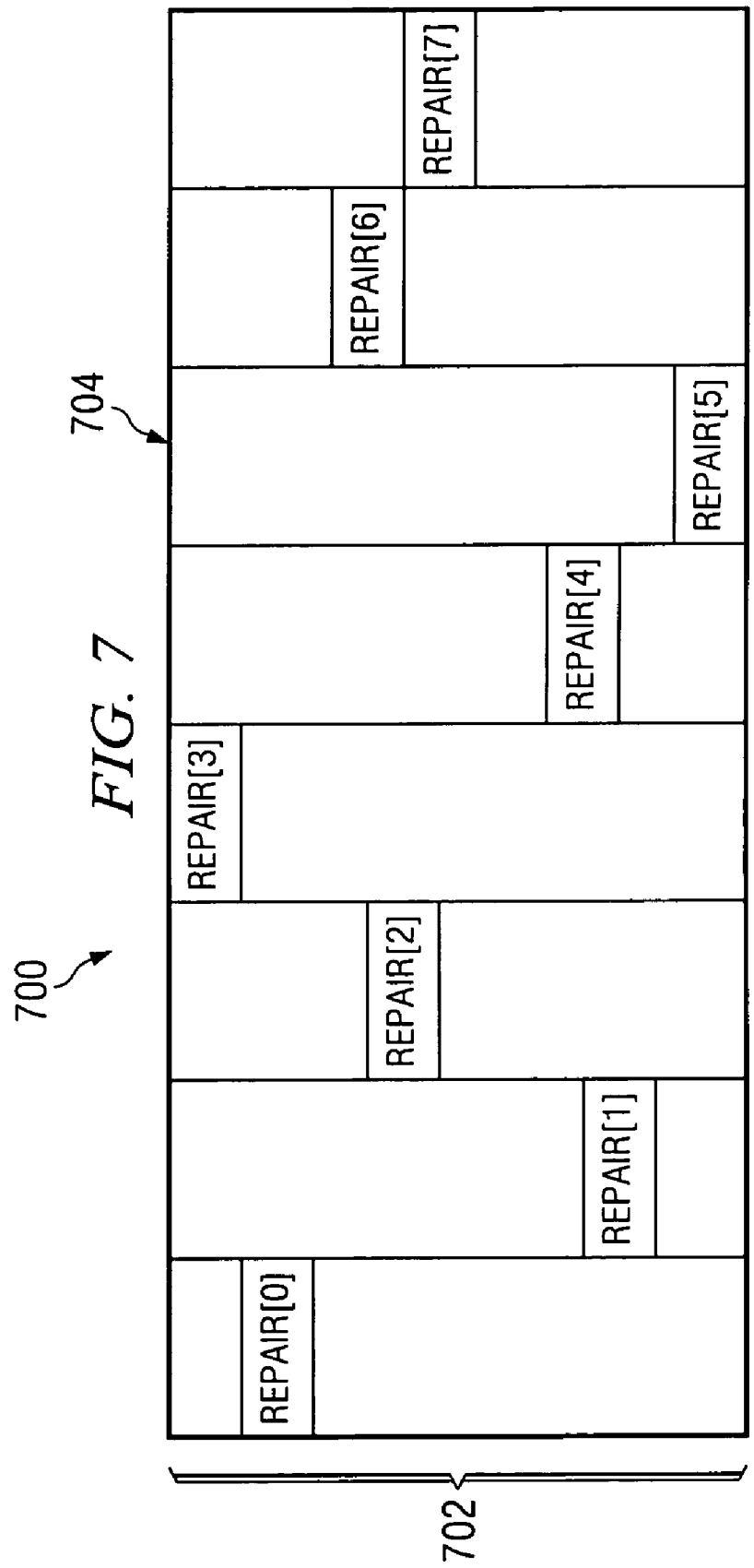

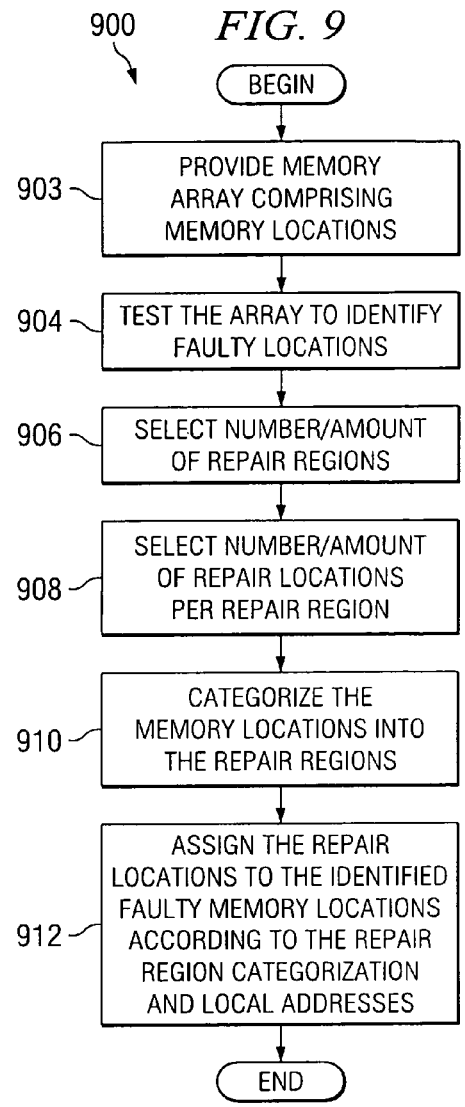
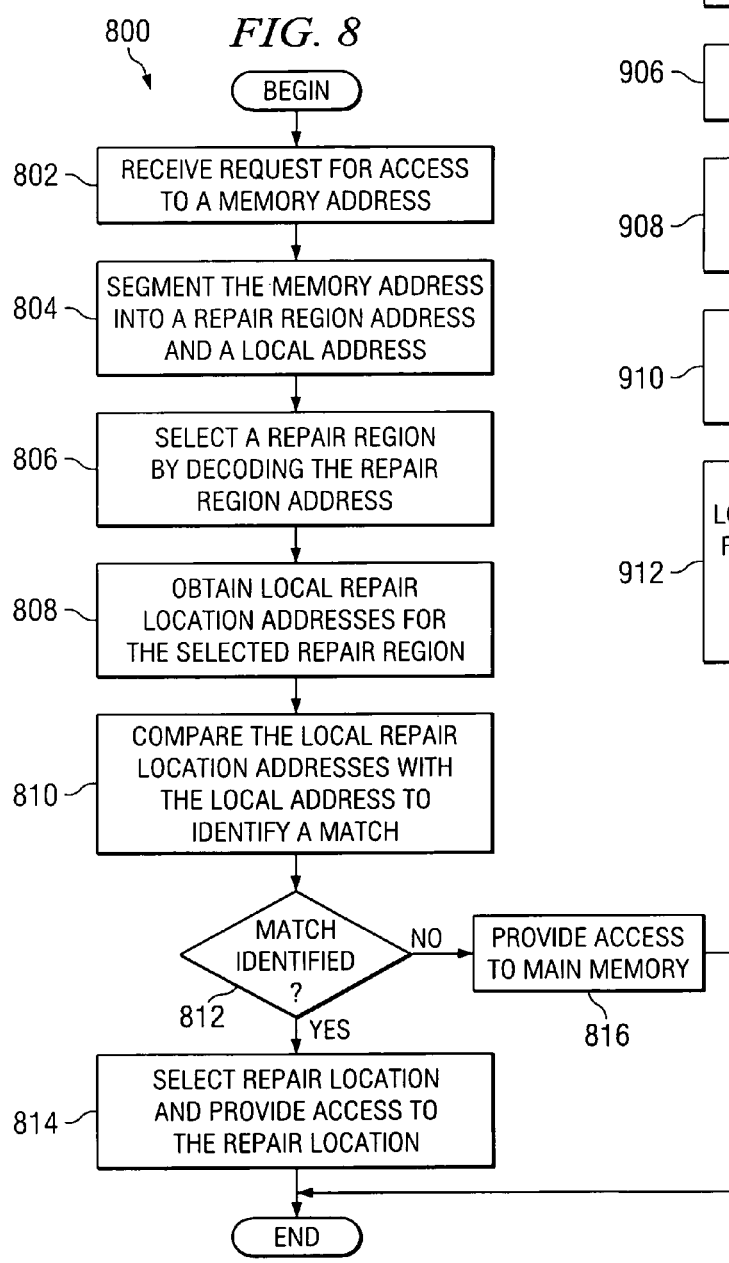

DECODER BASED SET ASSOCIATIVE REPAIR CACHE SYSTEMS AND METHODS

This application claims priority under 35 USC § 119 (e) (1) of provisional application No. 60/614,878 filed Sep. 30, 2004.

FIELD OF THE INVENTION

The present invention relates generally to memory devices, and more particularly, to systems and methods for repairing/replacing faulty memory cells in memory devices.

BACKGROUND OF THE INVENTION

Storage capacities of semiconductor memory devices continue to increase while dies on which the memory devices are fabricated continue to decrease. As a result, the number of memory cells present in memory devices and the complexity of the memory devices continues to increase as well. Additional memory cells and complexity require additional sense amplifiers, charge supply circuitry, addressing mechanisms, decoders, and the like. Further, the dimensions of components and/or structures present in memory devices shrink in response to the additional storage capacity. As a consequence, memory cells of memory devices can be more sensitive to defects, residues, and contaminants than memory cells of prior, smaller storage capacity memory devices. Such defects and contaminants can cause memory cells to be inoperable and unusable.

One technique to mitigate defects and contaminants and reduce the number of resulting defective cells is by tighter semiconductor fabrication process control and layout design/architecture. However, the ever-shrinking dimensions and increase in storage capacity can counteract the benefits of tighter process control and improvements in layout design/architecture. As a result, a significant number of memory devices are fabricated that include one or more defective memory cells. Without some type of correction mechanism, such memory devices can be unusable and/or introduce errors by their use.

One type of correction mechanism is to fabricate a number of redundant rows for memory devices. The number of redundant rows are formed in addition to original rows of memory cells. Then, during testing faulty memory cells and associated rows are identified. Subsequently, a selection device such as a fuse based device is employed to allow redundant rows to replace identified defective rows. As a result, addressing to memory cells in the original rows is rerouted to the replacement, redundant rows of memory cells. Thus, defective memory cells/rows are not apparent to external devices.

Another type of correction mechanism is to fabricate a number of redundant columns for memory devices in addition to original columns of memory cells. Defective or faulty memory cells/columns are then identified during testing. Subsequently, associated columns are replaced by one or more of the redundant columns by utilizing a selection mechanism such as a fuse based device. Accordingly, addressing to memory cells located in defective/faulty columns is rerouted to assigned redundant columns of memory cell. These defective memory cells/columns are not known to external devices.

One problem with the above correction mechanisms, redundant row replace and redundant column replace, is that large numbers of non-faulty cells can be needlessly replaced. For example, a single faulty memory cell, under a redundant row mechanism, requires that the row containing the single faulty memory cell be replaced. A single row in a memory device can have a large number of memory cells present, such as 512 or 1024 memory cells. Thus, one faulty memory cell can cause the other cells in the row, such as 511 or 1023, to be replaced. Such inefficiencies can reduce the storage capacity of memory devices by consuming valuable space on dies in order to provide for redundant rows and/or columns.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates memory devices and operation thereof by employing a decoder based repair cache system to correct or repair identified faulty memory locations. The repair cache system employs a decoder instead of relatively long comparators. The repair cache system can be employed to repair individual faulty memory locations instead of requiring full rows and/or columns to be repaired. Identified faulty memory locations are assigned to repair regions and repair registers within the particular repair regions. Then, during memory operations, memory addresses for identified faulty memory locations can be decoded and compared to select repair registers that are employed in operation instead of the identified faulty memory locations.

In one aspect, a decoder based repair cache system is disclosed. The repair cache system includes a decoder that selects local repair location addresses from repair sets according to a repair region address. Comparators compare the selected local repair location addresses with a local repair address to identify a match. Repair register banks that comprise a plurality of repair registers are selected if an associated comparator identifies a match. Then, a register within the associated register bank is selected according the repair region address for read/write access. If a match is not identified, a memory location from a main memory is selected for read/write access. Other systems and methods are disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7 is a diagram illustrating an exemplary repair register bank in accordance with an aspect of the present invention.

FIG. 8 is a flow diagram illustrating a method of operating a decoder based repair cache in accordance with an aspect of the present invention.

FIG. 9 is a flow diagram illustrating a method of configuring a repair cache system in accordance with an aspect of the present invention.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates memory devices and operation thereof by employing a decoder based repair cache system to correct or repair identified faulty memory locations. The repair cache system can be employed to repair individual faulty memory locations instead of requiring full rows and/or columns to be repaired. Identified faulty memory locations are assigned to repair regions and repair registers within the particular repair regions. Then, during memory operations, memory addresses for identified faulty memory locations can be decoded and compared to select repair registers that are employed in operation instead of the identified faulty memory locations.

Redundant rows of memory, redundant columns of memory, and redundant blocks of memory are commonly employed to recover from faulty/defective memory cells. Faulty columns and/or rows that respectively contain one or more faulty memory cells are identified during testing. Then, the faulty columns and/or rows are "corrected" or replaced by an identical number of redundant rows and/or columns. If, for example, entire rows of memory cells are faulty, replacement of the rows by redundant rows is relatively efficient. However, if only a single memory cell within a row is faulty, replacement of the entire row by a redundant row is relatively inefficient.

Some fabrication induced, large area defects can impact large portions of rows, columns, or blocks. For such large area defects, row, column, and/or block replacement mechanisms can be relatively efficient and practical. However, other fabrication defects include random, isolated defects that affect a small, isolated number of memory cells (e.g., one). For these random isolated defects, row, column, and/or block replacement mechanisms are relatively inefficient.

Figure 1A:
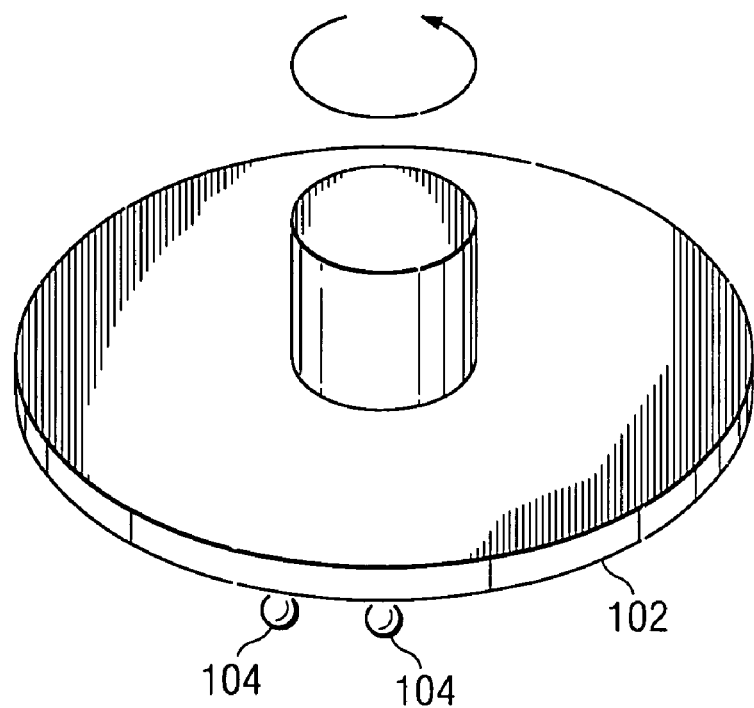
FIG. 1A is a diagram illustrating random, isolated defects that can result from chemical mechanical planarization.

FIG. 1A is a diagram illustrating random, isolated defects that can result from chemical mechanical planarization (CMP). Some layers formed on semiconductor devices can require a flattening, polishing layer operation in order to promote uniformity and to permit additional layers to be formed thereon. This flattening and polishing operation is referred to as planarization. One common type of planarization is the CMP process, which employs a rotating head 102 positioned on a rotating wafer in an opposite direction. A slurry flows across the wafer surface as the head and wafer rotated. The slurry includes chemicals and particles that facilitate planarization of the wafer. However, the slurry and/or the CMP head can undesirably include residue 104 that causes isolated, random damage to the wafer and memory devices formed thereon. The residue 104 can, for example, abrasively contact metal layers resulting in scratches and/or missing metal, leading to unwanted open circuits and/or increased resistance. The random damage can result in random, isolated defects and, as a consequence, random, isolated, faulty memory cells.

Figure 1B:
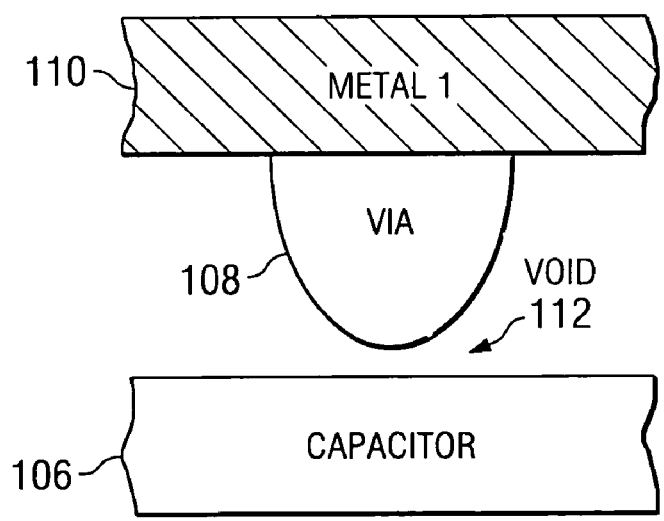
FIG. 1B is a diagram illustrating random, isolated defects that can result from via and contact voids during memory device fabrication.

FIG. 1B is a diagram illustrating random, isolated defects that can result from via and contact voids during memory device fabrication. Via formation and metallization are commonly performed during memory device fabrication in order to provide electrical connection to capacitors and other structures present within memory devices. However, vias or plugs can be defective in that they are not completely filled or that they were etched improperly thereby not properly connecting underlying structures. As an example, FIG. 1B shows a capacitor 106, a via 108, and a metal interconnect layer 110. In this example, the via 108 was not properly filled and, as a result, there is a void 112 present that breaks or prevents connection from the capacitor 106 to the via 108 and, therefore the metal interconnect layer 110. The void 112 can cause failure of a single memory cell by preventing access to the capacitor 106, but does not generally impact neighboring memory cells. As a result, the void 112 creates a random, isolated defect.

Figure 1C:
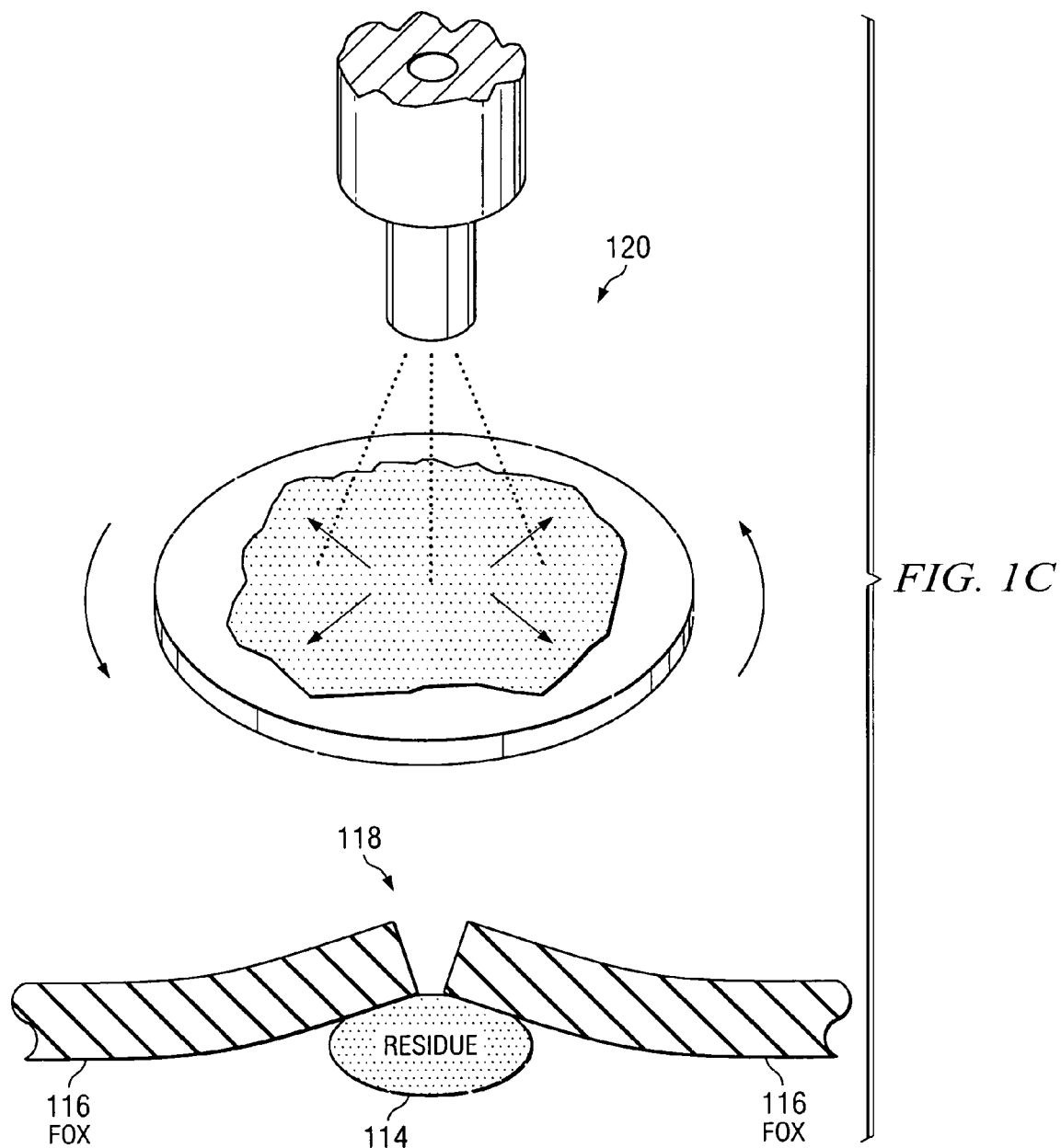
FIG. 1C is a diagram that depicts formation of a blister in an exemplary semiconductor device.

FIG. 1C is a diagram illustrating random, isolated defects that can result from etch or CMP residue during memory device fabrication. Etching processes are commonly performed during memory device fabrication, particularly with respect to capacitor formation and metallization. Etch residue from etch processes, such as plasma etching, can remain after completion of the etch process. Additionally, residue from planarization processes can also remain after completion. Subsequently formed layers cover the residue thereby trapping the residue. The formed layers become malformed or distorted as a result. Planarization processes, such as CMP, can damage the distorted layers by sheering off protruding crests, referred to as blisters.

FIG. 1C is a diagram that depicts formation of a blister in an exemplary semiconductor device. An etch process is performed that leaves undesired etch residue 114 on the device. A field oxide layer 116, in this example, is formed and distorted due to the presence of the residue 114. A metal layer deposition and planarization process 120 are then performed that results in formation of a blister 118 that breaks the field oxide layer 116. The blister 118 can lead to shorting and/or other problems and result in faulty memory cells.

The blisters, such as the blister 118, are a result of the undesired etch residue that remains after etching. The residue is typically randomly distributed. As a result, the blisters formed, and therefore the memory cells impacted, are also randomly distributed.

Figure 2B:
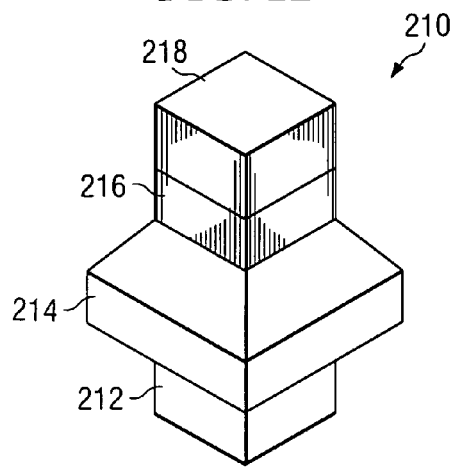
FIG. 2B is a diagram illustrating a non-volatile memory cell.
Figure 2A:
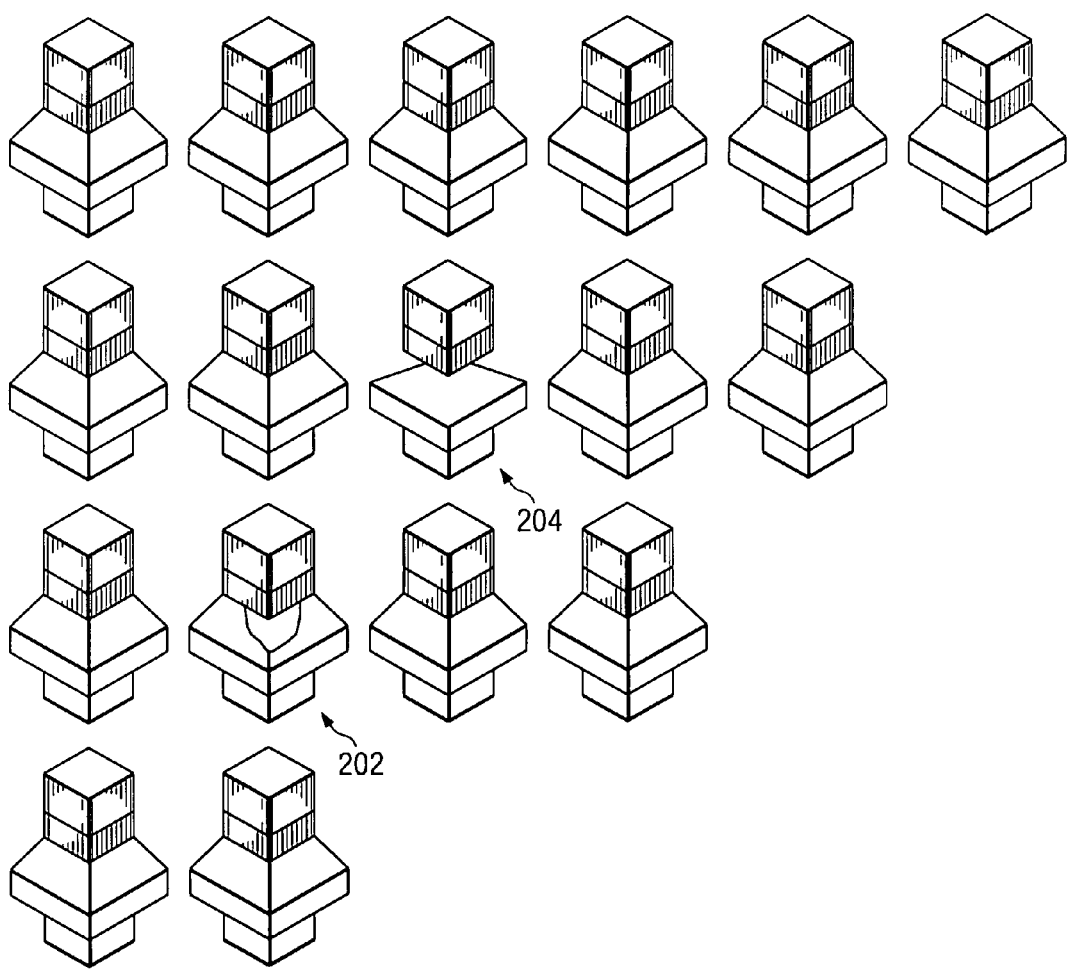
FIG. 2A is a diagram illustrating a memory array of some non-volatile memory and random defects therein.

FIG. 2A is a diagram illustrating an exemplary memory array 200 of some non-volatile memory and random defects therein. The memory array 200 can be comprised of nonvolatile memories such as ferroelectric memory (FeRAM), Magnetoresistive Random Access Memory (MRAM), and Ovonic Unified Memory (OUM). These memories include new layers for memory elements that exist between a substrate and upper metal layers that therefore have a high probability of being damages by CMP or etch process residues that can result in random, isolated bit failures. The newer non-volatile memories contain electrodes and special films or layers for electric fields, magnetic fields, and/or simple resistance. Random defects to these electrode layers or special films or layers are potential sources for weak or faulty bits, which likely are isolated random defects not efficiently solved by replacing entire rows, columns, and/or blocks. These defects can result from CMP processes, etching and leaving residues, plasma etching and leaving residues, forming oxide layers and leaving residues, forming other layers and leaving residues, and the like and can introduce open circuits into the electrodes and/or special layers.

FeRAM utilize ferroelectric capacitors that possess two characteristics required for a nonvolatile memory cell, that is to have two stable states corresponding to the two binary levels in a digital memory, and to retain their states without electrical power.

MRAM is a method of storing data bits using magnetic charges instead of the electrical charges used by DRAM (dynamic random access memory). A metal is defined as magnetoresistive if it shows a slight change in electrical resistance when placed in a magnetic field. By combining the high speed of static RAM and the high density of DRAM, proponents say MRAM could be used to significantly improve electronic products by storing greater amounts of data, enabling it to be accessed faster while consuming less battery power than existing electronic memory.

OUM uses thin-film materials to store information economically and with excellent solid-state memory properties. The thin-film material is a phase-change chalcogenide alloy similar to the film used to store information on commercial CD-RW and DVD-RAM optical disks.

Optical memory disks use laser light to write small spots by converting the thin film back and forth from amorphous (disordered atomic structure) to crystalline (regular, highly repetitive, and ordered atomic structure). The digital data of 1s and 0s are stored as amorphous (high resistance and non-reflective) or crystalline (low resistance and reflective) structures. OUM devices store data in a similar manner but use electrical energy controlled by small transistors to electronically convert the material to crystalline or to amorphous (thus a 1 or a 0). This electronic solid-state memory stores data in a much smaller area and with higher speeds for both read and write than its optical counterpart.

The operating speed of OUM memory technology is similar to DRAM and many orders of magnitude faster than Flash write. Also, unlike conventional Flash memory, OUM memory is fully random accessible for memory addressing. Any given bit can be uniquely addressed and then written or read by the customer. Further, Flash memory "wears out" (fails) after about 100,000 write cycles, while the OUM memory state can be written more than about 10 trillion times, making this memory useful for program storage (Flash) as well as general purpose interactive (DRAM) data storage memory.

The memory array 200 is illustrated with two defective memory cells 202 and 204. Defects to special films present in the memory cells cause the cells 202 and 204 to improperly operate, thereby being defective or faulty.

FIG. 2B is a diagram illustrating an exemplary non-volatile memory cell 210. The memory cell 210 is of a more recent design such as FeRAM, OUM, and MRAM. The memory cell 210 includes a lower electrode 212, a special film 214, an upper electrode 216, and an extra via 218. The special film 214 has properties dependent on the type of memory (e.g., ferroelectric, magnetoresistive, phase-change ability) and can be sensitive to random defects. The special film 214, if damaged, only impacts the memory cell 210 and does not negatively impact other or surrounding memory cells. Similarly, damage to the lower electrode 212 and the upper electrode is limited to the memory cell 210.

The above figures and descriptions illustrate examples of some types of random defects that can occur in semiconductor device fabrication as appreciated by the inventor of the present invention that lead to random, isolated memory cell or bit failures. Some other types of random defects include oxide defects, blisters, missing metal/conductive material, CMP scratches, and CMP residue.

Figure 3A:
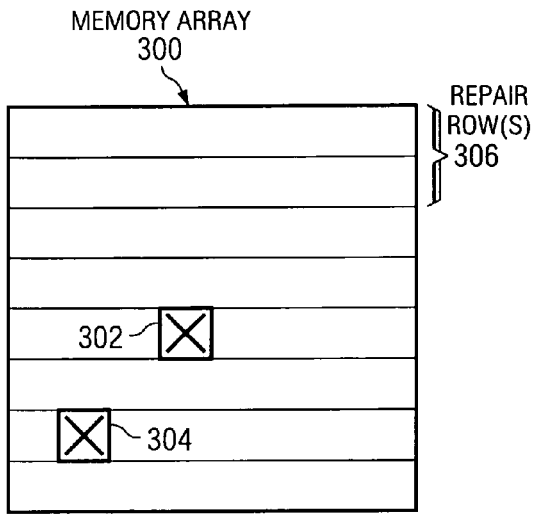
FIG. 3A is a diagram illustrating repair row correction mechanisms.

FIG. 3A is a diagram illustrating repair row correction mechanisms. A memory array 300 is shown comprised of a number of rows of memory cells/bits. Testing identifies first and second faulty memory cells 302 and 304 within the array 300. Redundant repair rows 306 are employed to replace the rows containing the faulty memory cells 302 and 304. A typical row in a memory device includes 1024 memory cells. Therefore, a single defective memory cell requires 1024 memory cells to be replaced. This type of replacement is relatively inefficient because other cells in the replaced rows were not defective.

Figure 3B:
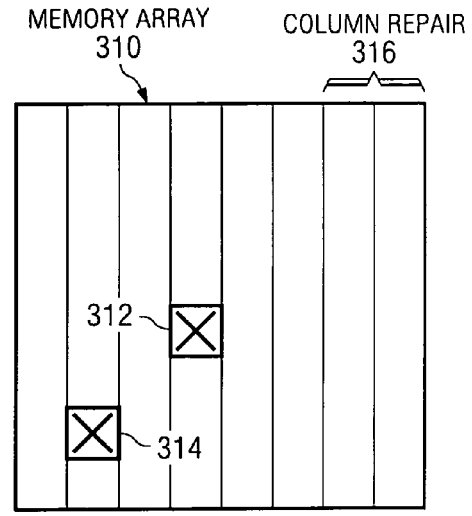
FIG. 3B is a diagram illustrating repair column correction mechanisms.

FIG. 3B is a diagram illustrating repair column correction mechanisms. Here, a memory array 310 is comprised of a number of columns of memory cells/bits. Testing has identified first and second faulty memory cells 312 and 314 within the array 310. Under this correction mechanism, redundant repair columns 316 replace both columns comprising the first and second faulty memory cells 312 and 314. Typical columns are about 512 memory cells tall. Thus, in this example, replacement of a single faulty memory cell requires replacement of 512 memory cells (of which 511 are not defective). Again, this correction mechanism is relatively inefficient for isolated random defects because a large number of cells were replaced that operated correctly.

Figure 3C:
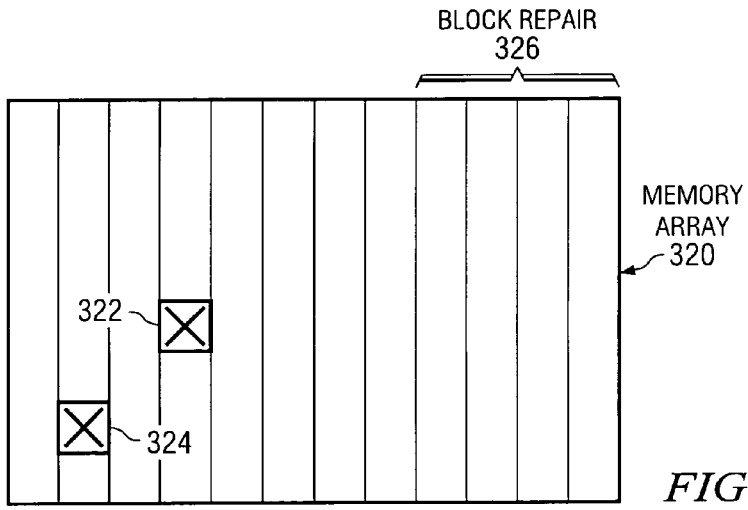
FIG. 3C is a diagram illustrating block repair correction mechanisms.

FIG. 3C is a diagram illustrating block repair correction mechanisms. A memory array 320 is comprised of blocks of memory cells. Respective blocks are comprised of a fixed number of rows and columns. In order to correct a defective memory cell, an entire block comprising the defective/faulty memory cell is replaced. Testing identified first and second faulty memory cells 302 and 304. In order to correct the identified faulty memory cells 302 and 304, two redundant blocks of memory cells 326 are employed. Once again, this correction mechanism is relatively inefficient as a large number of properly working memory cells are unnecessarily replaced.

Figure 4:
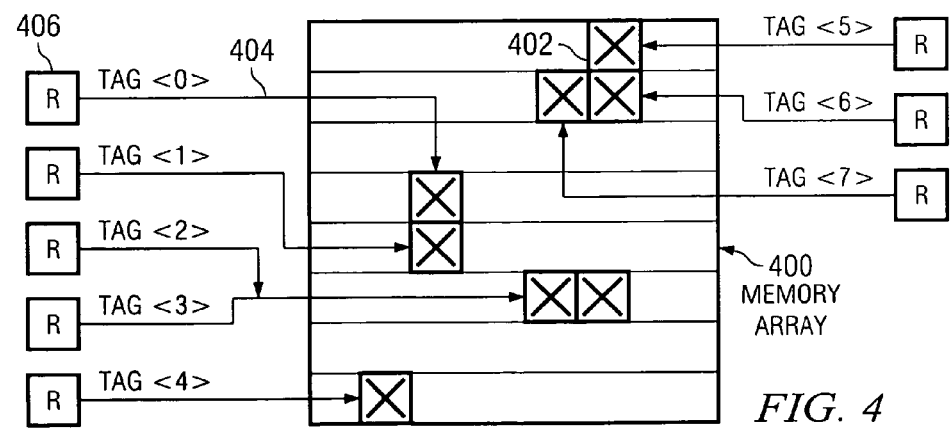
FIG. 4 is a diagram illustrating operation of a repair cache in accordance with an aspect of the present invention.

FIG. 4 is a diagram illustrating operation of a repair cache in accordance with an aspect of the present invention. The repair cache is operative to repair/correct faulty memory cells including those that result from random, isolated defects in a relatively efficient manner.

FIG. 4 shows a memory array 400 comprised of a number of rows and columns. Due to random, isolated defects incurred during fabrication, such as those described supra, a number of faulty memory cells 402 are present. Typically, testing is performed that includes reading and writing to cells within the memory array 400, wherein cells that fail to properly store and maintain correct values are deemed faulty. A repair cache system of the present invention is operable to efficiently repair/correct the faulty memory cells 402.

Respective faulty memory locations 402 are replaced by repair data locations 406, also referred to as repair resources and/or repair locations, on a one for one basis. The repair data locations can store a varied number of bits such as, for example, 1 bit, 8 bits, 16 bits, 32 bits, and the like. It is noted that the repair data locations can be a single memory cell. The faulty memory locations can, likewise, respectively comprise a varied number of bits or a single memory cell. It is further noted that memory cells can be single bit memory cells or multi bit memory cells (e.g., 2 or more bits). Addresses to the faulty memory cells 402 are redirected towards the replacement data caches by address caches 404 that store pointers to the replacement data caches 406. As a result, only a single memory cell or small number of memory cells can be employed to correct a defective memory cell and is, therefore, typically more efficient than row replacement, column replacement, and/or block replacement mechanisms for random, isolated defects.

The repair cache of the present invention differs from typical, conventional memory caches. The repair cache of the present invention maintains a list of only identified faulty memory addresses and includes separate repair resources aside from a main memory or array. In contrast, a conventional memory cache only maintains a list of cached memory addresses and does not maintain separate resources for the cached addresses. Furthermore, the conventional memory cache stores data from a main memory whereas the repair cache of the present invention replaces data from a main memory.

Figure 5:
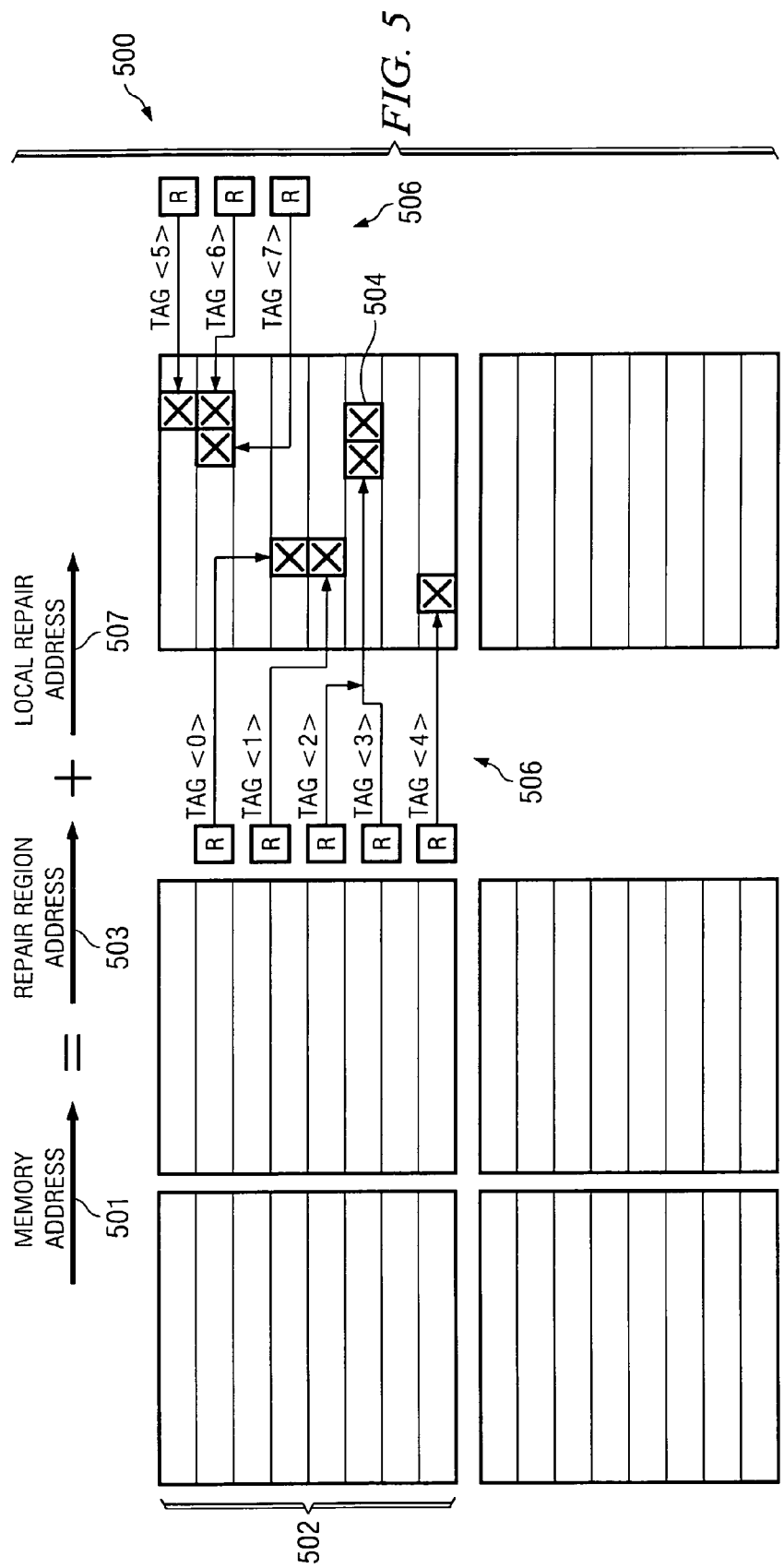
FIG. 5 is a diagram illustrating a portion of a memory array configured for a decoder based associative repair cache in accordance with an aspect of the present invention.

FIG. 5 is a diagram illustrating a portion of a memory array 500 configured for a decoder based associative repair cache in accordance with an aspect of the present invention. The memory array 500 is provided for illustrative purposes and it is appreciated that the present invention contemplates other memory array(s) having alternate sizes and/or configurations.

The memory array 500 has a number of memory locations that are employed to store, maintain, and provide information content. The memory array 500 can be volatile or non-volatile memory and can be of a suitable memory type including, but not limited to, FeRAM, OUM, and MRAM. The memory locations typically store a word (e.g., 16-bits, 32-bits, 54-bits, and the like) of information content and are addressable by a memory address 501.

At some point, the memory locations are tested in order to identify faulty memory locations 504, which are memory locations that include 1 or more faulty memory cells. A number of suitable mechanisms can be employed to identify faulty memory cells and, therefore, faulty memory locations. One example of a suitable mechanism is to write selected patterns of data to memory cells, read patterns of data from the memory cells, and then compare the read patterns to the written patterns to identify faulty memory cells. Another example of a suitable mechanism is to repeatedly perform cycles of writing a first value to memory cells and then read back from the memory cells expecting the first value to be read back and then writing a second value to the memory cells and then reading back from the memory cells expecting the second value to be read back. Other suitable mechanisms of identifying faulty memory locations can be employed.

The memory locations of the array 500 are organized or configured into repair regions 502, which are associated with blocks or groups of memory locations. A portion of the memory address, referred to as a repair region address 503, is employed to identify regions of which memory locations are associated with. The repair regions 502 respectively include one or more local repair registers or repair locations 506 that can be employed to repair or correct identified faulty memory locations 504 within the respective repair region. A local repair address 507, which is also a portion of a memory location's memory address 501, is employed to access the local repair locations 506.

During read/write operations for the memory array 500, requests for identified faulty memory locations are routed to a particular repair region according to the repair region address 503 and a particular local repair location or register within the particular repair region according to the local repair address 507.

Figure 6:
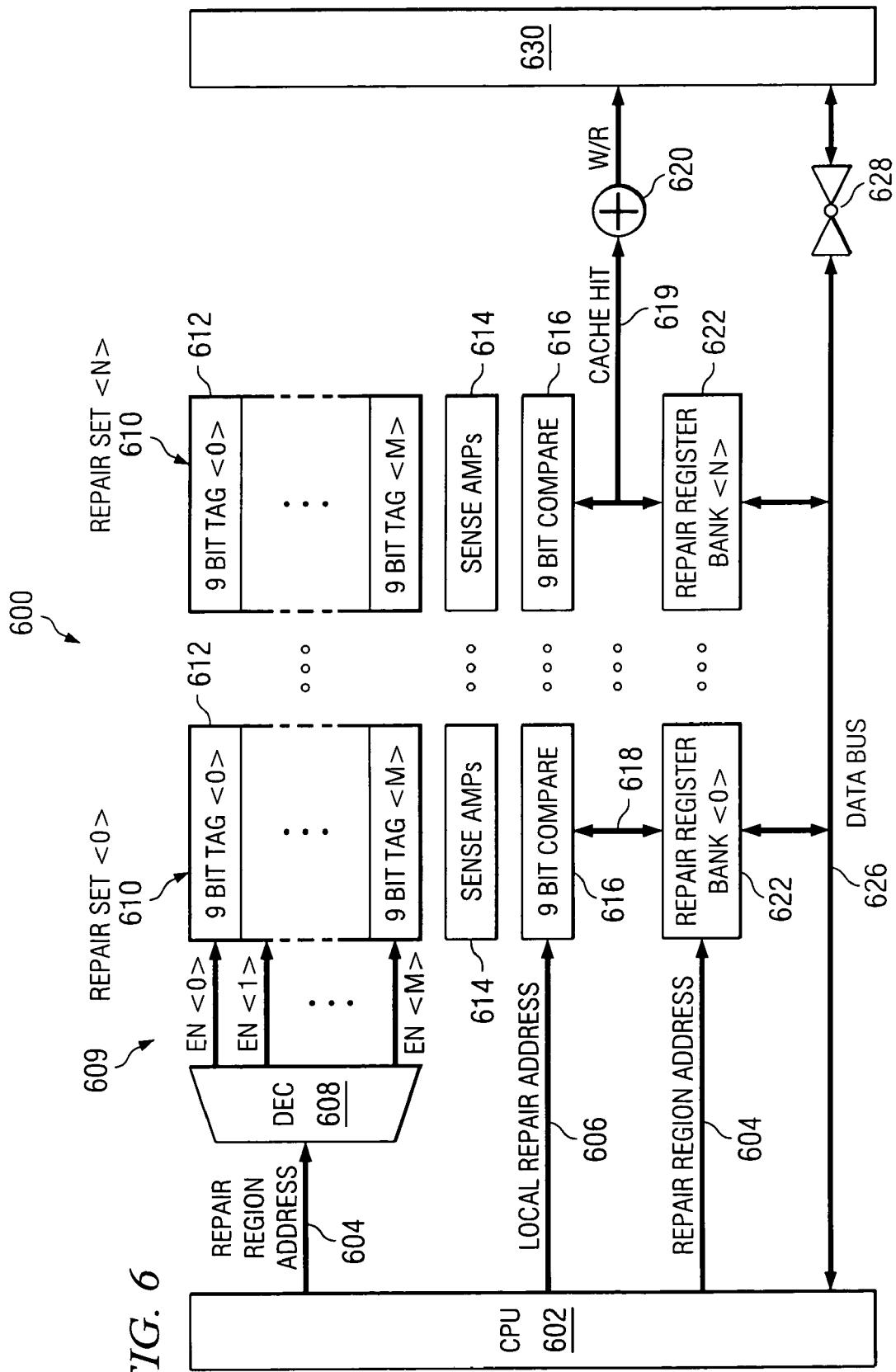
FIG. 6 is a block diagram illustrating a decoder based set associative repair cache system 600 in accordance with an aspect of the present invention.

FIG. 6 is a block diagram illustrating a decoder based set associative repair cache system 600 in accordance with an aspect of the present invention. The system 600 is operable to correct for faulty memory cells by having redundant memory cells located in a repair registers, which are accessed instead of the faulty memory cells for read/write operations. By employing repair registers, storage requirements for addressing repair registers can be reduced compared with conventional row, column, and/or block repair mechanisms. Furthermore, the reduced storage requirements mitigate die area employed for repairing/correcting faulty memory cells.

It is noted that for memory operation, a memory device generally receives memory addresses and provides contents for the memory addresses for read operations and stores contents for the memory addresses for write operation. As an example, a memory device having 256 k 32-bit memory locations has a storage capacity of 8 Mbits. In order to address the memory locations, an 18-bit pointer (memory address) is required. During operation a CPU uses an 18-bit pointer and retrieves a 32-bit number from the memory device for a read operation. For a write operation, the CPU again uses an 18-bit pointer but also provides a 32-bit number, which the memory device stores at the memory location referenced by the 18-bit pointer.

The system 600 includes a central processor unit 602, a decoder 608, repair sets 610, repair register banks 622, a main memory 630, and a data bus 626. For illustrative purposes, the system 600 is described with an 18 bit memory address scheme, however it is appreciated that the present invention contemplates other suitable bit sized addressing schemes.

The central processor unit 602 is generally operable to access memory locations of the main memory 630 by memory addresses in order to read to and write from addressed memory locations. It is appreciated that the central processor unit 602 performs other processor related functions and can be one of a number of processors present in an electronic device. The central processor unit 602, as well as some or all of the system 600, can be part of an electronic device such as, but not limited to, a personal computer, a personal digital assistant, a mobile/cellular telephone, a laptop computer, a notebook computer, a digital camera, and the like.

For read/write requests by the central processor unit 602, the memory address is split into two portions, a repair region address 604 and a local repair address 606. The repair region address 604 points to a particular repair region and the local repair address points to a repair location within the repair region. The number of repair regions is related to a size of the repair region address 604. For example, if the repair region address 604 is 10-bits in size, there are 1024 repair regions. The local repair address 606 points to a particular repair location. The number of local repair addresses present in the system 600 is bounded at an upper limit according to a size of the local repair address 606. For example, if the local repair address 606 is 8-bits in size, there can be 1 to 256 local repair addresses and corresponding repair locations employed. However, the selected number of local repair addresses is less than the upper bound and is selected according to a number of factors including, estimated number of faulty memory locations, expected number of faulty memory locations, and the like. For example, a suitable number of local repair addresses for an 8-bit local repair address is eight, in one example wherein there are less than eight faulty memory locations expected per region.

The decoder 608 receives the repair region address 604 and decodes the address into one of M enable signals 609. The number of enable signals M generated by the decoder 608 is a function of the size of the repair region address 604. For example, if the repair region address 604 is 10-bits in size, M is equal to 2E10 or 1024. It is noted that only one of the M enable signals 609 is ON or enabled while the remaining enable signals are disabled or OFF.

The repair sets 610 receive the enable signals 609 from the decoder 608. The repair sets 610 comprise M local repair location addresses or pointers 612, also referred to as TAGs and have a single local repair location address per repair region. The number of repair sets 610 present, N, is related to the number of local repair addresses selected per region. Thus, if there are eight local repair addresses per region, N is equal to eight and there are eight repair sets. The local repair location addresses 612 can also include a repair enable indicator (not shown), which can be a single bit indicating whether to local repair location address is a valid repair or not. The repair sets 610 each provide a selected local repair location address according to the enable signals 608 for the repair region 604.

The comparators 616 receive the selected local repair location addresses from the repair sets 610 and the local repair address 606. The comparators 616 perform a bit by bit comparison of the local repair address 606 and the selected local repair location addresses and generates a hit or match signal 619 and can provide the match signal 618 on identifying a match to a particular register bank. The comparators 616 also check the repair enable indicator, if present, to determine if the match is valid. Sense amps 614 can be present and employed to provide the selected local repair location addresses to the comparators 616.

The repair register banks 622 contain repair locations for the repair regions that are addressable by the repair region address 604. The repair register banks 622 receive the match signal 619 and the repair region address 604. On receiving the match signal 619, the associated repair register bank is addressed by the repair region address to access a repair location. Then, the addressed repair location is coupled to the data bus 626 for read and/or write operation(s) and the main memory 630 is blocked from the data bus 626 by a repair mode circuit 620. A switch 628 is present and controlled by the repair mode circuit 620 in order to block and provide access to the main memory 630. Register banks that do not receive the match signal are also blocked from the data bus 626. If none of the repair register banks 622 receive the match signal 618, the repair mode circuit 620 couples the main memory 630 to the data bus 626 and the repair register banks 622 are blocked from the data bus 626.

Upon initiation of a read/write operation, the central processor unit 602 provides a memory address associated with a memory location to write data to and/or read data from. The memory address is separated into the repair region address 604 and the local repair address 606. The decoder 608 decodes the repair region address 604 into one of M enable signals 609 that are provided to the individual local repair location addresses and thereby select local repair location addresses. The selected local repair location addresses are then compared by the comparators 616 to the repair address 606 and can also be checked for validity. If a match is identified by the comparators 616, a match or hit signal 618 is provided to an associated repair register bank as well as the repair mode circuit 620. The associated and matching repair register bank then employs the repair region address 604 to address a repair location and then couple the repair location to the data bus 626. If no match is identified, the repair mode circuit 620 connects the main memory 630 to the data bus 626 and the read/write operation proceeds with the main memory providing access to the memory location addressed by the memory address.

The repair cache system 600 is configured prior to normal read/write operation. Generally, repair regions and repair locations for the repair regions are selected according to factors such as estimated faulty memory locations, expected faulty memory locations, and the like. It is also noted that repair regions can have varied numbers of valid repair locations therewith. For example, some repair regions can have zero valid repair locations associated. Once the numbers of repair regions and repair locations are selected, memory locations of the main memory 630 are tested to identify faulty and valid memory locations. The identified faulty memory locations are repaired by assigning repair locations within their repair regions.

FIG. 6 is illustrated with examples having specific bit lengths and address lengths in order to facilitate a better understanding of the present invention. It is appreciated that present invention is contemplated as being employed for any suitable bit sizes, memory address size, number of repair regions, and the like. Additionally, other components can be present in the system such as, encoders, amps and decoders. For example, a memory controller can be present to control components and perform the read/write operations.

The decoder 608 is employed instead of relatively long comparators. Otherwise comparators having a width at least equal to the memory addresses might be required and repair registers would be stored according to full memory address (e.g., 18-bits). Additionally, comparators could be required for each repair register in order to operate in a timely matter. The repair cache system 600, and particularly the decoder 608, allows relatively shorter comparators to be employed and less of them and also allows for repair registers to be stored with relatively shorter addresses (e.g., 10-bits).

FIG. 7 is a diagram illustrating an exemplary repair register bank 700 in accordance with an aspect of the present invention. The register bank 700 is depicted as having eight repair registers or data locations 704 for illustrative purposes only. It is appreciated that register banks in accordance with the present invention can have a greater or lesser number of repair registers. The repair registers 704 have a bit size or width 702 that typically comprises a memory word (e.g., 8, 16, 32, and 64 bits) in an associated memory device. Individual repair registers 704 can be employed to repair or replace individual memory words of a main memory (not shown) thereby correcting faulty memory locations/cells. It is appreciated that for a memory device that includes a main memory and a repair register bank, that the number of repair registers employed is a function of the number of faulty/defective memory locations. As a result, in operation, zero or more of the repair registers 704 can be employed. Generally, the number of repair registers provided are selected so as to replace or repair an expected or estimated number of faulty memory locations within given memory devices.

In view of the foregoing structural and functional features described above, methodologies in accordance with various aspects of the present invention will be better appreciated with reference to the above figures. While, for purposes of simplicity of explanation, the methodologies of FIGS. 8 and 9 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 8 is a flow diagram illustrating a method 800 of operating a decoder based repair cache in accordance with an aspect of the present invention. The method 800 can be employed to correct for faulty memory locations within a main memory by selectively routing read/write requests to a repair locations categorized within repair regions instead of the faulty memory locations.

The main memory, typically comprised of one or more memory arrays, includes a number of memory locations of a fixed size and addressable by the memory address. The main memory is segmented into multiple repair regions that comprise fixed numbers of memory locations.

The method 800 begins at block 802 wherein a request for access to a memory address is received. The request is for read and/or write access to the memory address in which information content is written to a memory location addressed by the memory address or read from the memory location addressed by the memory address. Typically, a processor or other electronic device initiates the request.

The memory address is segmented into a repair region address and a local address at block 804. The repair region address is comprised of a fixed number of bits and indicates a particular repair region of the main memory. The local address is also comprised of a fixed number of bits and can indicate a local repair location assigned to the particular repair region. As an example, an 18-bit memory address can be segmented into a 9-bit repair region address and an 8-bit local address.

The repair region address is decoded to select a repair region from a plurality of repair regions at block 806. The selected repair region is one of the plurality of repair regions present for the repair cache with which the memory location addressed by the memory address is located. The number of repair regions present in the repair cache is implementation dependent.

The selected repair region is typically selected by connecting output lines of the decoder to a plurality of repair sets that include entries corresponding to local repair locations addresses. Repair locations for individual repair regions are uniquely associated with local repair location addresses. Each of the repair sets includes at most one local repair location address per repair region.

Local repair location addresses are obtained for the repair region at block 808. The local repair location addresses respectively reference repair locations within the selected repair region and include an address portion that corresponds to local repair addresses and a repair enable indicator that indicates whether the address portion is for a valid repair. Typically, one local repair location address is obtained per repair set. Continuing, the obtained local repair location addresses are compared at block 810 with the local repair address to identify a match at decision block 812. Generally, a plurality of comparators, one for each repair set, are employed to perform a bit by bit comparison of the obtained local repair location addresses with the local repair address and also to identify if the addresses are valid.

On identifying a match at 812, a repair location or register associated with the matching local repair location address is selected and provided for access for the memory address at block 814. The match indicates that a memory location referenced by the memory address within main memory has been identified as faulty. The selected repair location corrects or repairs the identified faulty memory location by being accessed instead of the faulty memory locations.

Typically, a plurality of repair register banks individually associated with the plurality of comparators is present. One of the repair register banks is selected by the comparator that identified the match. The selected register bank is addressed with the local repair address and/or the repair region address to access the repair location, which is then typically coupled to a data bus for a read/write operation. Other control signals and/or operations can be employed to perform the read/write operation.

On failure to identify a match at 812, access to a memory location addressed by the memory address within the main memory is provided at block 816. The memory location is assumed to be valid and is provided for read/write access. Typically, the memory location is coupled to a data bus for transferring information content to the memory location for a write operation and from the memory location for a read operation. Other control signals and/or operations can be employed to perform the read/write operation.

The sizes for memory addresses, memory locations, repair address, repair indicator, and repair locations can vary on implementation from above provided examples and still be in accordance with the method 800 and the present invention.

FIG. 9 is a flow diagram illustrating a method 900 of configuring a repair cache system in accordance with an aspect of the present invention. The method 900 is be employed to test and identify faulty memory cells and locations located within a memory array and configure the repair cache system so that repair locations are employed in place of identified faulty memory locations. The method 900 is described with respect to a single memory array for illustrative purposes, but can be employed for portions of an array and/or multiple memory arrays and still be in accordance with the present invention.

The method 900 begins at block 902 wherein a memory array comprising a number of memory cells and memory locations is provided. The memory cells can be single bit memory cells and/or multi bit memory cells. The memory locations comprise a number of cells or bits, such as a word (e.g., 16 bits).

The memory array is tested at block 904 in order to identify faulty memory locations. The identified faulty memory locations are those memory locations that have one or more faulty memory cells. It is noted that the method 900 also contemplates not identifying any faulty memory cells.

A number/amount of repair regions for a repair cache is selected at block 906. The number of repair regions selected can vary by region factors such as, size of the memory array, expected faulty memory locations, location of faulty memory locations, identified faulty memory locations, components to be employed in a repair cache and the like. Generally, more repair regions result in less memory locations per region.

A number/amount of repair locations or registers is selected at block 908. The number of repair locations selected can vary by repair factors such as, size of the memory array, expected faulty memory locations, location of faulty memory locations, identified faulty memory locations, components to be employed in a repair cache and the like. Typically, there are a fixed number of repair locations/registers configured for each of the repair regions.

The memory locations of the memory array are categorized into the plurality of repair regions at block 910. The repair regions are of a fixed number of memory locations dependent upon the number selected at block 906. The memory locations are categorized into the repair regions according to a repair address portion of their memory address. The repair locations are assigned to the identified faulty memory locations at 912 according to repair region and local addresses. The repair locations are already associated with the repair region in which the identified faulty memory locations are present. The repair locations are assigned a local repair location address comprised of local address portion of their memory address.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A set associative repair cache system comprising:
   a main memory comprising identified valid memory locations and identified faulty memory locations;
   a plurality of repair sets that respectively comprise local repair location addresses arranged and selectable according to a plurality of repair regions;
   a decoder that receives a repair region address portion of a memory address and decodes the repair region address to select local repair location addresses of the plurality of repair sets;
   a plurality of comparators associated with the plurality of repair sets that compares selected local repair location addresses with a local repair address portion of the memory address to identify a matching local repair location address by a matching comparator of the plurality of comparators;
   a plurality of repair register banks associated with the plurality of comparators and the plurality of repair sets that respectively comprise repair registers arranged and selectable according to the plurality of repair regions, wherein a repair register is selected for read/write access from an associated repair register bank of the plurality of repair register banks that is associated with the matching comparator and addressed by the repair region address on identifying the matching local repair location address; and
   wherein a memory location within the main memory addressed by the memory address is selected for read/write access on a failure to identify the matching local repair location address.

2. The system of claim 1, wherein the plurality of repair register banks is comprised of non-volatile memory.

3. The system of claim 1, wherein the plurality of repair register banks is comprised of volatile memory.

4. The system of claim 1, wherein the main memory is comprised of ferroelectric memory cells.

5. The system of claim 1, wherein the local repair location addresses respectively comprise a local address.

6. The system of claim 1, wherein the local repair locations addresses respectively comprise a local address and a repair enable indicator.

7. The system of claim 1, wherein the memory locations and the repair registers have a size of 64-bits.

8. The system of claim 1, wherein the memory addresses have a size of 18 bits.

9. The system of claim 1, further comprising a data bus selectably coupled to the main memory and the plurality of repair register banks.

10. The system of claim 9, further comprising a central processing unit coupled to the decoder, the plurality of comparators, and the plurality of register banks that initiates the read/write requests, provides the repair region address and the local repair address, and reads/writes information content from the plurality of register banks and the main memory.

11. The system of claim 1, further comprising a repair mode enable circuit coupled to a data bus and main memory, wherein the matching comparator generates a match signal and the repair mode enable circuit blocks access to the data bus on receiving the match signal.

12. The system of claim 1, further comprising a plurality of sense amps that provide the selected local repair location addresses to the plurality of comparators.

13. A method of operating a set associative repair cache comprising:
   receiving a request for read/write access to a memory address;
   segmenting the memory address into a repair address and a local repair address;
   decoding the repair address to select a repair region from a plurality of repair regions;
   obtaining local repair location addresses for the selected repair region;
   comparing the local repair location addresses with the local repair address to identify a matching local repair location address;
   on identifying a match, selecting a repair register associated with the matching local repair location address and providing the requested read/write access to the selected repair register; and
   on failure to identify a match, selecting a memory location within a memory array according to the memory address and providing the requested read/write access to the selected memory location.

14. The method of claim 13, wherein comparing the local repair location addresses with the local repair address to identify the matching local repair location address is performed by a plurality of comparators.

15. The method of claim 14, wherein the plurality of comparators perform a bit by bit comparison of the local repair address with an address portion of the local repair location addresses.

16. The method of claim 13, wherein comparing the local repair location addresses with the local repair address to identify the matching local repair location address further comprises comparing a repair enable indicator portion of the local repair location addresses.

17. The method of claim 13, wherein the matching local repair location address has a repair enable indicator set to valid.

18. The method of claim 13, wherein selecting the repair register associated with the matching local repair location address comprises selecting a repair register bank associated with the matching local repair location and selecting the repair register from the selected repair register bank according to the repair address.

19. The method of claim 17, wherein providing the requested read/write access to the repair register comprises coupling a data bus to the selected repair register.

* * * * *